United States Patent
McChesney et al.

(10) Patent No.: US 10,242,844 B2
(45) Date of Patent: Mar. 26, 2019

(54) ROTATING RF ELECTRIC FIELD ANTENNA FOR UNIFORM PLASMA GENERATION

(71) Applicant: Lam Research Corporation, Fremont, CA (US)

(72) Inventors: Jon McChesney, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 357 days.

(21) Appl. No.: 14/553,870

(22) Filed: Nov. 25, 2014

(65) Prior Publication Data

US 2016/0093471 A1 Mar. 31, 2016

Related U.S. Application Data

(60) Provisional application No. 62/058,080, filed on Sep. 30, 2014.

(51) Int. Cl.
*H01J 37/32* (2006.01)

(52) U.S. Cl.
CPC ......... *H01J 37/3211* (2013.01); *H01J 37/321* (2013.01); *H01J 37/32155* (2013.01); *H01J 37/32183* (2013.01)

(58) Field of Classification Search
CPC ............. H01J 37/3211; H01J 37/32155; H01J 37/32183; H01J 37/32715; H01J 37/321; H01L 21/67069
See application file for complete search history.

(56) References Cited

U.S. PATENT DOCUMENTS

| | | | | |
|---|---|---|---|---|
| 2001/0021422 A1* | 9/2001 | Yamakoshi | ....... | H01J 37/32082 427/569 |
| 2004/0083971 A1* | 5/2004 | Holland | ................ | H01J 37/321 118/721 |
| 2005/0034811 A1* | 2/2005 | Mahoney | .......... | H01J 37/32954 156/345.24 |
| 2013/0105086 A1* | 5/2013 | Banna | ...................... | H05H 1/46 156/345.38 |

* cited by examiner

*Primary Examiner* — Yuechuan Yu
(74) *Attorney, Agent, or Firm* — Penilla IP, APC

(57) ABSTRACT

A plasma processing chamber includes a substrate support for receiving and holding a substrate. A window in the plasma processing chamber is oriented over the substrate support. A plurality of transformer coupled plasma coils is disposed over the window. The TCP coils are disposed radially equidistant from one another. Each TCP coil is connected to a power circuitry at one end and the opposite end is electrically grounded. The power circuitry includes an RF source and a phase-shift modulator. The RF source is used to apply RF power to the TCP coils at a generator frequency to generate RF electric field. The phase-shift modulator coupled to the RF source is configured to apply a modulation frequency that is phase-shifted to allow the RF electric field applied to each of the TCP coils to transition in a rotating pattern.

14 Claims, 7 Drawing Sheets

(2-dimensional)

(3-dimensional)

$E = E1$ (Sine function of coil A) + $E2$ (Cosine function of coil B)

$E = E1$ (coil A) + $E2$ (coil B) + $E3$ (coil C)

ROTATING RF ELECTRIC FIELD ANTENNA FOR UNIFORM PLASMA GENERATION

CLAIM OF PRIORITY

This application claims priority from U.S. Provisional Application No. 62/058,080, filed on Sep. 30, 2014, and entitled, "Rotating RF Electric Field Antenna for Uniform Plasma Generation," which is incorporated herein by reference in its entirety.

FIELD OF THE INVENTION

The present invention relates generally to semiconductor fabrication, and more particularly, plasma chambers and structures/devices used in such chambers.

DESCRIPTION OF THE RELATED ART

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

A plasma contains various types of radicals, as well as positive and negative ions. The chemical reactions of the various radicals, positive ions, and negative ions are used to etch features, surfaces and materials of a substrate. For the etching process, a transformer coupled plasma coil is used to provide power to the plasma.

It is in this context that embodiments related to plasma processing chambers, equipment, parts and operations arise.

SUMMARY

Disclosed are systems, devices and methods for use in a plasma processing chamber. The plasma processing chamber can be configured for etching wafers/substrates, and in particular layers of dielectric or features using metals/other materials. The processing etch chamber (i.e., plasma processing chamber) is a transformer coupled plasma (TCP) coil system, and a plurality of TCP coils are provided. In the embodiments defined herein, the TCP coils are disposed over a window defined in a ceiling of the processing etch chamber. The TCP coils are distributed radially and are arranged equidistant from one another. One end of the TCP coil is coupled to a power source that provides the power that is used to sustain the plasma generated in the etch chamber and the other end is connected to ground. The power source is used to apply RF power to the TCP coils to generate RF electric field. The RF power applied to the TCP coils is phase shifted by modulating the RF power so as to allow the electric field to transition in a rotating pattern. The transitioning of the electric field simulates rotation of a physical coil. The transition of the electric field results in uniform plasma generation by smoothing out the non-uniformities.

In one embodiment, a plasma processing chamber is provided. The plasma chamber includes a substrate support for receiving and holding a substrate. The chamber has a window that is oriented over the substrate support. A plurality of transformer coupled plasma (TCP) coils is disposed over the window. The TCP coils are disposed radially equidistant from one another. Each of the TCP coils is connected to a power circuitry at one end and the opposite end of the TCP coils is electrically grounded. The power circuitry includes a RF source to apply RF power to the TCP coils at a generator frequency to generate RF electric field. A phase-shift modulator is coupled to the RF source and used to apply a modulation frequency to the RF power. The modulation frequency is phase-shifted so as to allow the RF electric field applied to each of the TCP coils to transition in a rotating pattern.

In some embodiments, the modulation frequency applied depends on the RF power supplied by the RF source. In some embodiments, the amount of phase-shifting done to the modulation frequency depends on the number of TCP coils provided over the window.

In some embodiments, when a pair of TCP coils is provided, the TCP coils are disposed orthogonal to one another and the modulation frequency is phase-shifted by 90°.

In some embodiments, when 4 TCP coils are used, the TCP coils are disposed at 45° to one another and the modulation frequency is phase-shifted by 45°.

In some embodiments, the power circuitry includes a match circuit. The match circuit includes an RF input that is coupled to the RF source and an RF output that is coupled to each one of the plurality of TCP coils. In some other embodiments, the power circuitry includes a separate match circuit with a corresponding RF output coupled to respective one of the TCP coils and the RF input of these match circuits are connected to the RF source.

In some embodiments, when the RF source includes a single RF power generator, the RF power applied to the plurality of TCP coils is split so as to provide same RF power to each one of the plurality of TCP coils at any given time. The RF power applied to each one of the plurality of TCP coils is phase-shifted by the phase-shift modulator. Amount of phase shifting is based on number of TCP coils provided over the window.

In some embodiments, the RF source includes a plurality of RF power generators. The number of RF power generators corresponds to number of TCP coils disposed over the window so as to allow each TCP coil to be driven by a distinct RF power generator. Each one of the plurality of RF power generators is coupled to a corresponding phase-shift modulator. The phase-shifting of the modulation frequency applied by the corresponding phase-shift modulators is coordinated to allow the RF electric field applied to the plurality of TCP coils to transition in the rotating pattern. Amount of phase shifting depends on number of the TCP coils.

In some embodiments, a probe is provided to measure the RF electric field at different pre-defined points where the electric field is applied.

In some embodiments, the probe is either a mathematical probe or a physical probe.

In some embodiments, the TCP coils are either a single loop coil or a multi-loop coil.

In some embodiments, each TCP coil is made of two sub-coils. The RF power is coupled to one end of each sub-coil and the other end of each of the two sub-coils is connected to ground.

In some embodiments, the TCP coils are of any geometrical shape.

A device for providing power to plasma in a plasma processing system is provided. The device includes a plurality of transformer coupled plasma (TCP) coils disposed over a window. The window is defined in a ceiling of the plasma processing chamber. Each one of the plurality of TCP coils is distributed radially equidistant from one another. One end of each of the TCP coils is coupled to a power circuitry and an opposite end is electrically grounded. The power circuitry includes a RF source and a phase-shift modulator. The RF source is used to apply RF power to each of the plurality of TCP coils at a generator frequency to generate RF electric field. The phase-shift modulator is coupled to the RF source and configured to apply a modulation frequency to the RF electric field that is phase-shifted so as to allow the RF electric field applied to each one of the TCP coils to transition in a rotating pattern.

Other aspects of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

Figure 1:
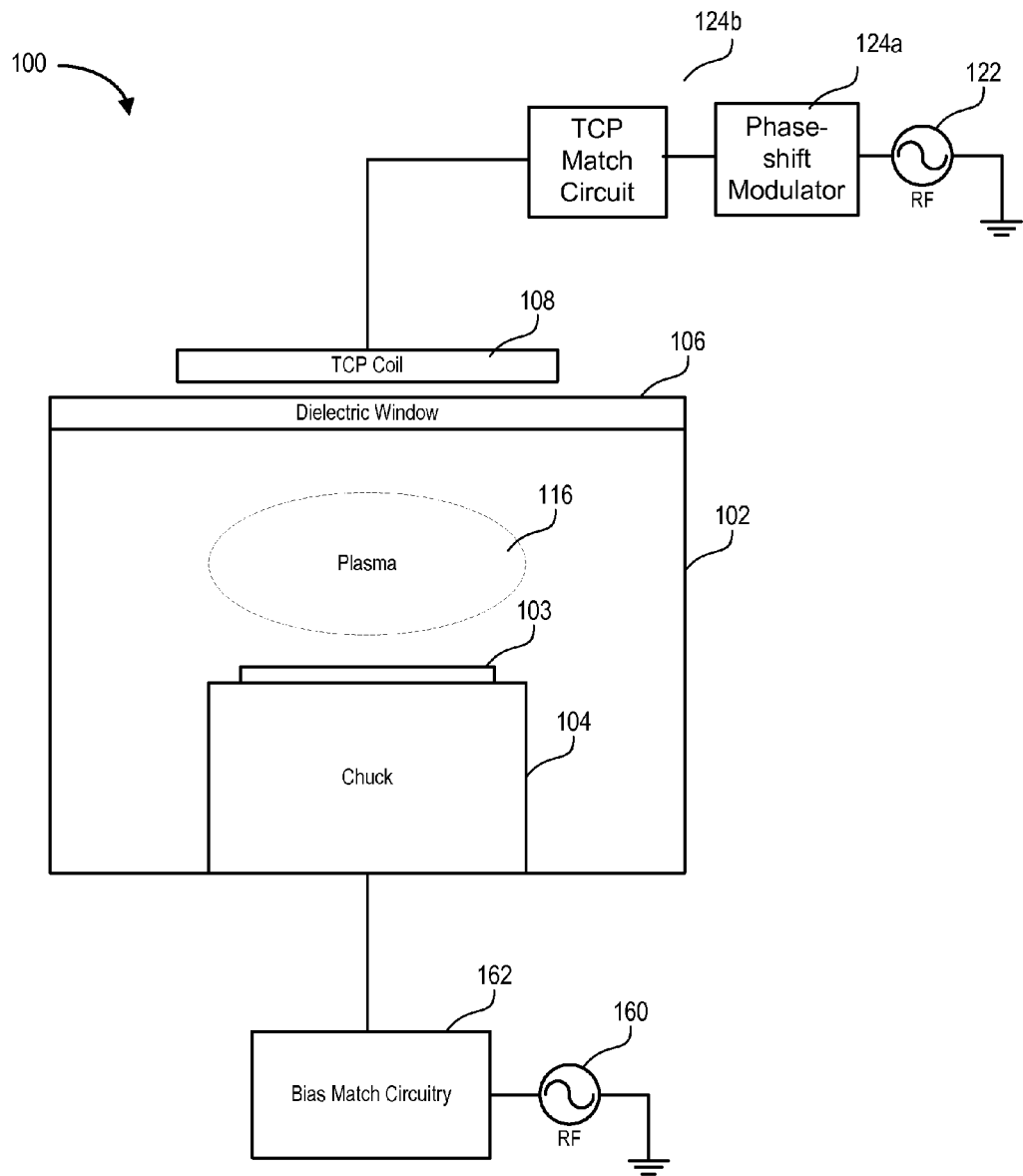
FIG. 1 illustrates an exemplary plasma processing chamber utilized for etching operations, in accordance with one embodiment of the present invention.

Disclosed are devices and methods for distributing power to plasma formed within transformer coupled plasma (TCP) powered chambers. A plurality of TCP coils are distributed radially equidistant from one another. One end of each of the plurality of TCP coils is coupled to RF power source and the opposite end is electrically grounded. The RF power source includes a RF generator to supply the RF power and a phase-shift modulator to modulate the RF power applied to each of the TCP coils, the modulation is phase-shifted to cause electric field applied to the TCP coils to transition in a rotating pattern. The modulator modulates the RF power by generating a modulator frequency that wraps around the generator frequency of the RF power. The modulator frequency is determined based on the generator frequency provided by the RF power.

In the various embodiments described hereunder, the physical antenna (defined by the TCP coils) remains stationary but the phase shifting of the modulation applied to the RF power causes rotational transition of the electric field simulating the rotation of the physical TCP coils. The rotational transitioning of the electric field results in the smoothing out of any non-uniformities to the electric field provided to the plasma. The amount of phase-shifting depends on the number of TCP coils disposed in the plasma processing chamber. The shape of the TCP coils may be modified to improve the rotational as well as radial uniformity of the electric field.

In some embodiments, the TCP coils may be two dimensional in structure. In other embodiments, the TCP coils may be three-dimensional in structure. In some embodiments, the orientation of the TCP coils may be adjusted to avoid concentration of the electric field in the center by adjusting the structure of the TCP coils to reduce the amount of overlapping of the TCP coils in the center. In some embodiments, to improve electrical uniformity each TCP coil may be formed from a pair of sub-coils with each sub-coil being driven by a separate RF generator. Alternately, each sub-coil in the pair of sub-coils may be coupled to the same RF generator. In some embodiments where the two sub-coils are coupled to the same RF generator, the two sub-coils may be connected to each other by conductive wires to allow the electric field to be transmitted to both the sub-coils. When multiple RF generators are used, each RF generator may be coupled to a distinct phase-shift modulator or could be coupled to a single phase-shift modulator. When multiple phase-shift modulators are used, the modulators may be configured to coordinate the phase-shifting applied to the respective TCP coils so as to allow uniform rotational transition of the RF electric field. Probes may be used to measure the electric field to determine the strength of the electric field in different locations.

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

FIG. 1 illustrates a plasma processing system utilized for etching operations, in accordance with one embodiment of the present invention. The system includes a chamber 102 that includes a substrate support 104, a window 106, and a coil unit 108. The substrate support 104 can be a chuck, such as an electrostatic chuck for supporting the substrate, when present.

Further shown is a bias RF generator 160 to drive the substrate support assembly 104, which can be defined from one or more generators. If multiple generators are provided, different frequencies can be used to achieve various tuning characteristics. A bias match 162 is coupled between the RF generators 160 and a conductive plate of the substrate support assembly 104, such as the chuck. When the chuck 104 is an electrostatic chuck, the chuck also includes electrostatic electrodes to enable the chucking and de-chucking of the substrate. Broadly, a filter and a DC clamp power supply can be provided to enable the chucking and de-chucking. Other control systems for lifting the substrate off of the chuck 104 can also be provided. Although not shown, pumps are connected to the chamber 102 to enable vacuum control and removal of gaseous byproducts from the chamber during operational plasma processing.

The window 106 can be defined from a dielectric material. In some embodiments, the dielectric material of the window 106 may be ceramic. Usage of other dielectric materials are also possible, so long as they are capable of withstanding the conditions of a semiconductor etching chamber. Typically, chambers operate at elevated temperatures ranging between about 50 Celsius and about 120 Celsius. The temperature will depend on the etching process operation and specific recipe of plasma generating materials used. The chamber 102 will also operate at vacuum conditions in the range of between about 1 m Torr (mT) and about 100 m Torr (mT). Although not shown, chamber 102 is typically coupled to facilities when installed in a clean room, or a fabrication facility. Some exemplary facilities include plumbing that provide processing gases, vacuum, temperature control, and environmental particle control.

These facilities are coupled to chamber 102, when installed in the target fabrication facility. Additionally, chamber 102 may be coupled to a transfer chamber that will enable robotics to transfer semiconductor substrates into and out of chamber 102 using typical automation.

A phase-shift modulator 124a is provided to modulate the RF power provided to the TCP coils. The phase-shift modulator is coupled to the RF power source 122 at one end and the TCP coils at the other end. The RF power source 122 is configured to provide RF power to the TCP coils at a generator frequency to generate RF electric field. The phase-shift modulator is configured to provide a modulation frequency that wraps over the generator frequency of the RF power to provide the necessary modulation. In one embodiment, the modulation frequency may depend on the generator frequency. Thus, for example, if the generator frequency is in the mega hertz, then the modulation frequency may be few kilo hertz. In one embodiment, the generator frequency applied to the TCP coils is about 13.6 MHz. The modulation frequency applied by the phase-shift modulator, in this embodiment, may be between about 1 kHz to about 500 kHz. In some embodiments, the modulation frequency may be between about 100 kHz to about 300 kHz. The phase-shift modulator may include a phase shifting mechanism, such as time-shifter, to allow phase-shifting of the modulation frequency applied to the RF power. In one embodiment, amount of phase-shifting depends on the number and/or orientation of TCP coils provided in the plasma processing system. In one embodiment, if a pair of TCP coils is provided in the plasma processing system, then the TCP coils may be distributed radially equidistant from one another. As a result, the two TCP coils may be oriented orthogonal to one another. In this embodiment, the amount of phase shifting of the modulation frequency applied to the RF power may be about 90°. In another embodiment, if 4 TCP coils are provided in the plasma processing system, then the TCP coils may be oriented at 45° to each other. In this embodiment, the modulation frequency applied to the RF power supplied to each of the TCP coils may be phase shifted by about 45°. Similarly, when 3 TCP coils are used, each coil may be oriented at about 60° from one another and modulation frequency may be phase shifted by about 60°. The phase-shifted modulation transitions the magnetic field and with that the RF electric field. With the radial orientation of the TCP coils, the transitioning appears to follow a rotating pattern.

In addition to the phase-shift modulator, a match circuitry 124b may also be provided. The match circuitry 124b enables dynamic tuning of RF power provided to the TCP coils. The match circuitry 124a includes a RF input and a RF output. The RF input is coupled to the power circuitry that includes the RF source/phase-shift modulator unit and the RF output is coupled to the TCP coils 108. In one embodiment, the RF power provided to the TCP coils will be used to control uniform distribution (i.e., radial uniformity) of the ion density of the plasma over the substrate, when present. In one embodiment, the RF power applied to the TCP coils will be adjusted based on the processing parameters defined for a specific etching operation being performed on the semiconductor substrate disposed over chuck 104.

Figure 2A:
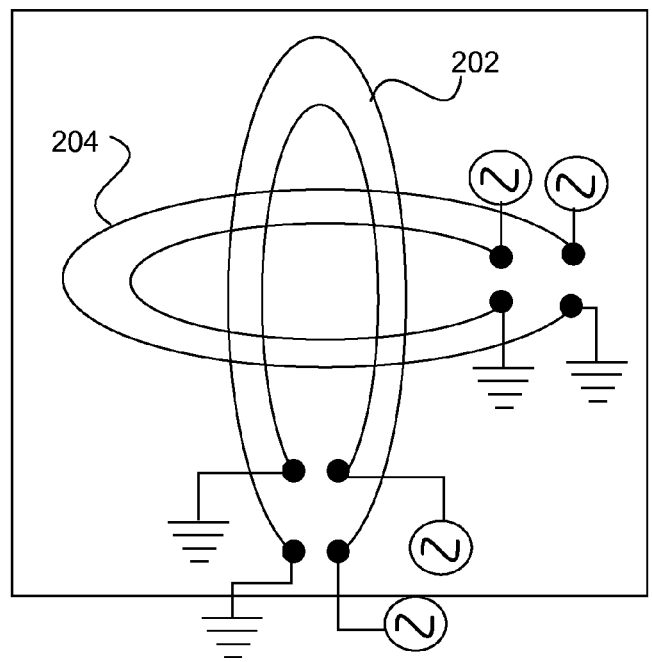
FIG. 2A illustrates a schematic representation of an exemplary coil configuration used for providing power to sustain plasma within a plasma processing chamber, in one embodiment.
Figure 2B:
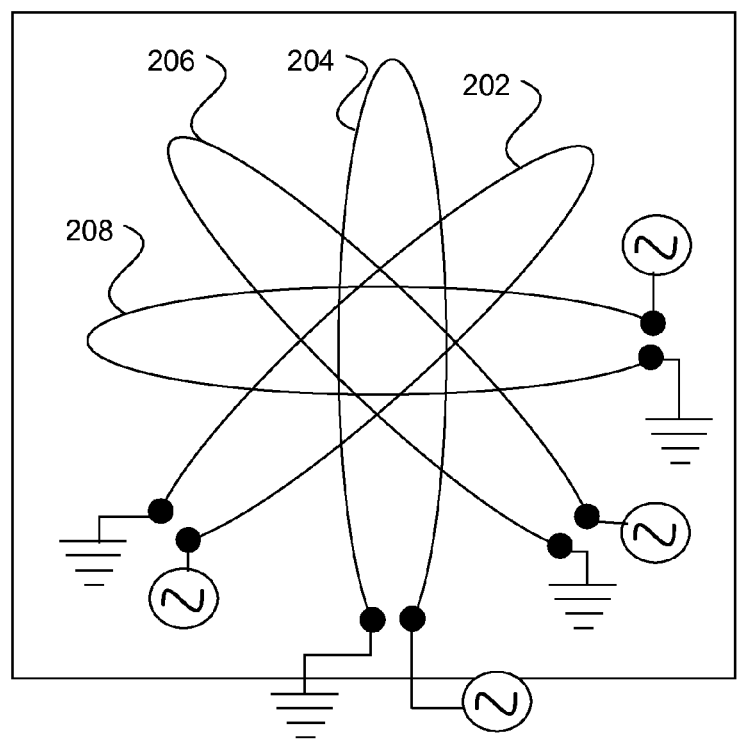
FIG. 2B illustrates an alternate schematic representation of an alternate exemplary coil configuration used for providing power to sustain plasma within a plasma processing chamber, in accordance to an alternate embodiment of the invention.

FIGS. 2A and 2B illustrate exemplary coil configurations of the plurality of TCP coils provided within the plasma processing system, in some embodiments of the invention. As mentioned with reference to FIG. 1, a plurality of TCP coils is configured to be disposed over window 106 over the plasma processing chamber 102. In the embodiment illustrated in FIG. 2A, a pair of TCP coils 202, 204, is included in the plasma processing system. Each TCP coil in the pair is distributed equidistant from one another in a radial orientation by orienting the coils orthogonal to one another. The TCP coils illustrated in FIG. 2A is a multi-loop coil having an inner loop and an outer loop. It should be appreciated that the constitution of the TCP coil of FIG. 2A is exemplary and should not be considered restrictive. As a result, single loop coil structures may also be engaged. Each loop is shown, by way of example, connected at one end to a RF source and the other end is electrically grounded. In one embodiment, the TCP coils are two dimensional in structure. In an alternate embodiment, the TCP coils may be three dimensional in structure.

FIG. 2B illustrates another exemplary configuration, in an alternate embodiment. As shown, the coil unit of FIG. 2B includes 4 TCP coils 202, 204, 206 and 208 that are distributed radially at regular intervals. As such, the TCP coils in the coil unit are distributed at 45° angle from one another. As with the TCP coil unit of FIG. 2A, each TCP coil is coupled to a separate, independent RF power source at one end and is electrically grounded at the opposite end. Of course, such configuration is exemplary. In alternate embodiments, the TCP coils may be coupled to a single RF power source at one end and may be independently grounded at the other end. The TCP coil in the coil unit of FIG. 2B is a single loop coil but a multi-loop coil may also be engaged.

Figure 2C:
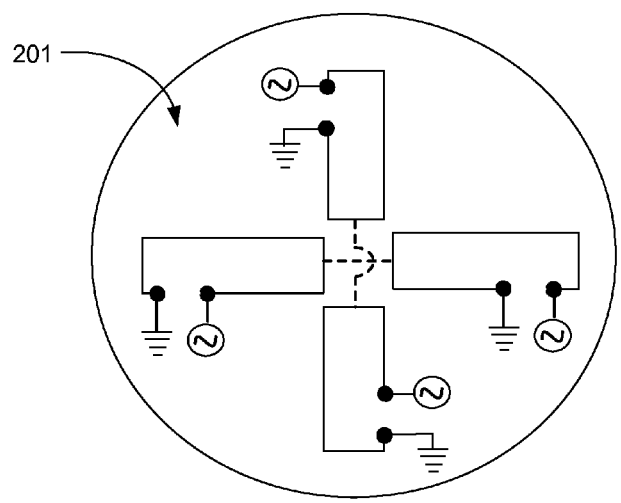
FIGS. 2C-2E illustrate some exemplary coil shapes and configuration used for providing power to sustain the plasma within the plasma processing chamber, in different embodiments of the invention.
Figure 2D:
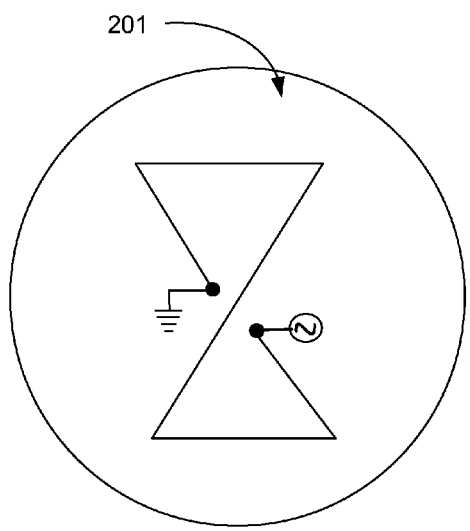
Figure 2E:
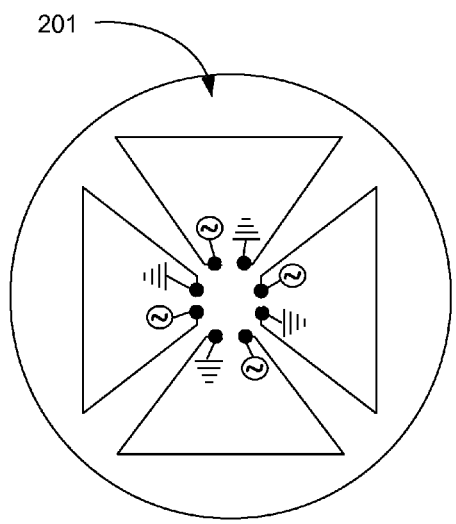

FIGS. 2C-2E illustrate additional configurations of the coil unit that may be provided in the plasma processing system. FIG. 2C illustrates a configuration wherein the coil unit includes a pair of TCP coils that are disposed orthogonal to each other. Each TCP coil is made of a pair of sub-coils. In one embodiment illustrated in FIG. 2C, each sub-coil is coupled to an independent RF source at one end and electrically grounded at the other end. In an alternate embodiment, the two sub-coils within each pair are electrically connected in the center to one another through a wired connection, as shown by the dotted lines. In this embodiment, both the sub-coils of the pair are connected to a single RF source at one end and are electrically grounded at the other end. It should be appreciated that the TCP coils illustrated in FIG. 2C are rectangularly shaped but can easily be configured to have other geometrical shapes.

FIG. 2D illustrates one such exemplary configuration, in one embodiment. The TCP coil in this configuration is shown to be a single loop coil with a specific geometrical shape that resembles two open-ended triangular shaped coils connected at one end and laid open at the other end. One of the open ends is connected to a RF power source and the other open end is electrically grounded. It should be appreciated that the TCP coil of FIG. 2D can be configured to be a multi-loop coil and could be two-dimensional or three-dimensional in structure. The TCP coil of FIG. 2D can easily be separated into two coils with each coil being either an open-ended triangular structure or a close-looped triangular structure.

FIG. 2E illustrates another exemplary geometrical shaped configuration, wherein the coil unit includes four TCP coils that are trapezoidal in nature and distributed radially equidistant from another. In this embodiment, as in FIG. 2C, each TCP coil is a single loop coil unit. However, the TCP coils of FIG. 2E may be configured to be a multi-loop coil, in other embodiments. In the embodiments illustrated in FIGS. 2C-2E, the modulation frequency provided to the RF power that is applied to the TCP coil unit allows the rotational transition of the electric field so that the electric field applied to area 201 within the plasma processing chamber is uniform.

Figure 3A:
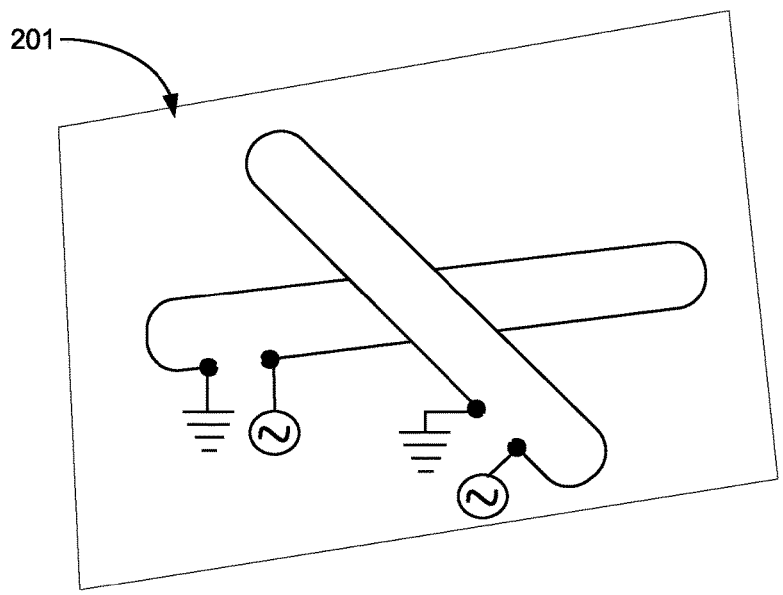
FIGS. 3A and 3B illustrate exemplary TCP coils used in providing power to the plasma processing chamber, in accordance to some embodiments of the present invention.
Figure 3B:
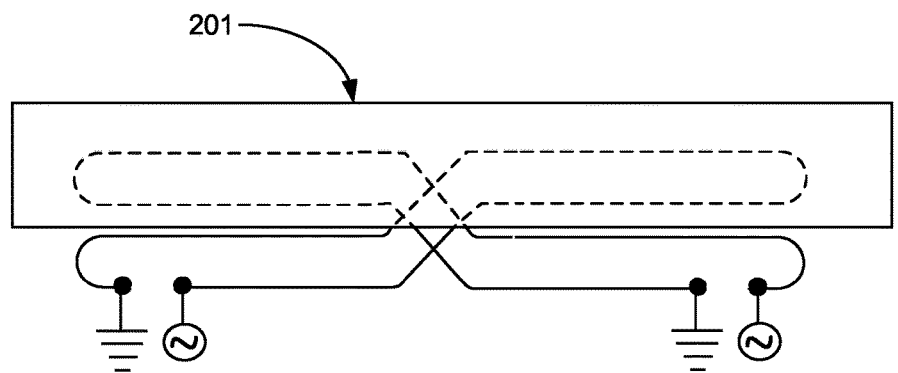

FIGS. 3A and 3B illustrate different configuration of the coil unit. FIG. 3A illustrates the TCP coils within the coil unit being oriented as a two-dimensional structure. The TCP coils may be single-loop coil, as shown in FIG. 3A or multi-loop coil. FIG. 3B illustrates the TCP coils in the coil unit being three-dimensional in structure.

Figure 4A:
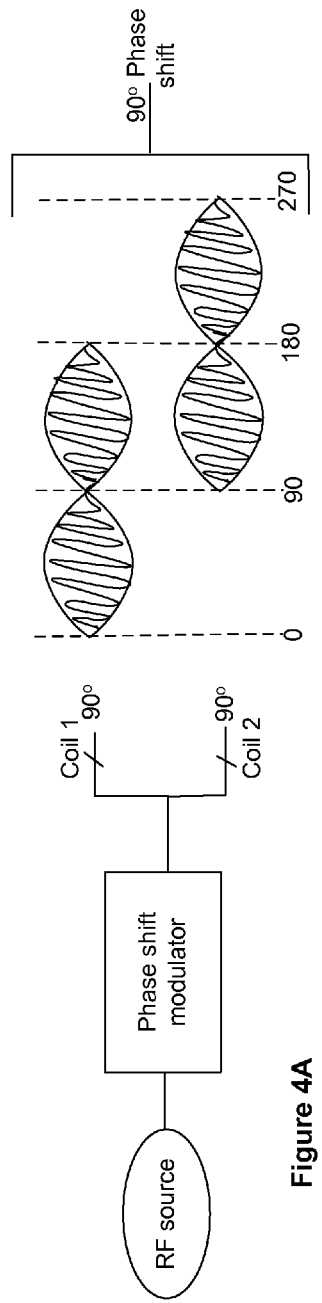
FIGS. 4A-4C illustrate a schematic representation of modulation applied by the phase-shift modulator to different TCP coil configurations, in some embodiments of the invention.
Figure 4B:
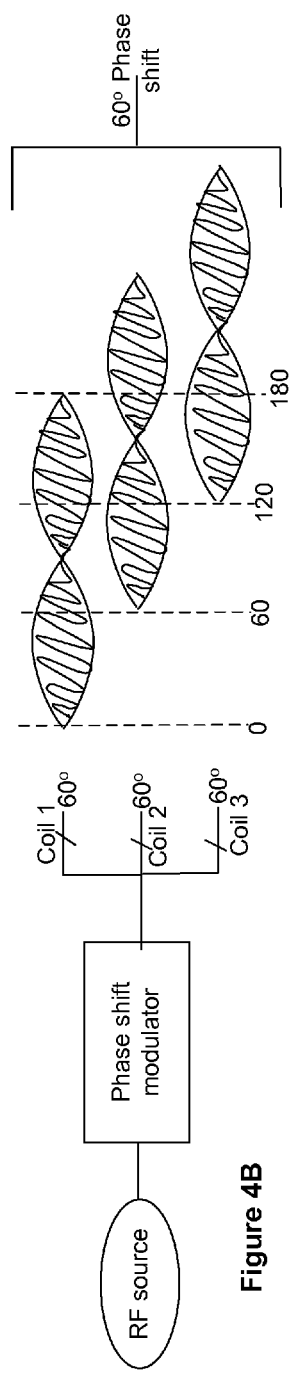
Figure 4C:
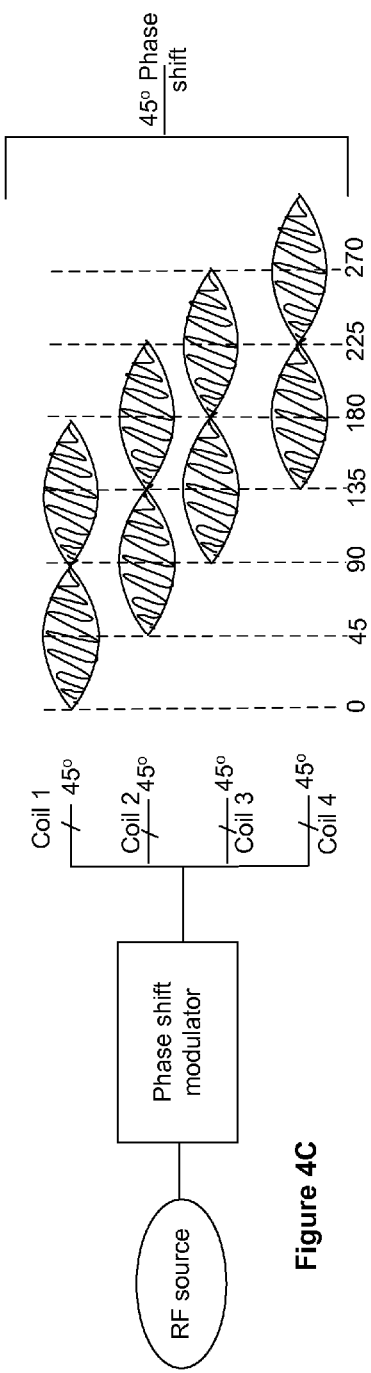

FIGS. 4A-4C illustrate the phase-shifted modulation applied to the RF power for different configurations of the TCP coils, in some embodiments of the invention. In the embodiment illustrated in FIG. 4A, two TCP coils are included within the coil unit. As mentioned earlier, the two TCP coils are distributed orthogonal to one another. Consequently, the phase-shift modulator is used to modulate the generator frequency provided by the RF power by phase-shifting the modulation by 90°. The phase-shift modulator generates the modulator frequency and applies it to coil 1 and coil 2 such that the modulator frequency applied to coil 2 is phase-shifted by 90° with reference to the modulator frequency applied to coil 1. This causes the rotational transition of the electric field resulting in a more uniform distribution of the electric field applied to the plasma processing chamber.

FIGS. 4B and 4C illustrate alternate coil configurations that result in different amount of phase shifting that is applied when providing the modulation frequency to the RF power for each TCP coil in the coil unit, in some embodiments. In the embodiment illustrated in FIG. 4B, the coil unit includes three TCP coils (coil 1, coil 2 and coil 3) that are uniformly distributed 60° from one another in a radial orientation. The modulation frequency applied to the RF power of each coil, in this embodiment, is phase shifted by 60°. Similarly, the embodiment illustrated in FIG. 4C includes a coil unit with 4 TCP coils that are radially distributed 45° from one another. In this embodiment, the modulation frequency applied to the RF power of each coil is phase shifted by 45°. As mentioned earlier, the modulation frequency applied to each coil depends on the amount of RF power applied to the TCP coils and the amount of phase-shifting for the modulation frequency applied to the TCP coils depends on the number and orientation of the TCP coils within the coil unit. It should be appreciated that in the various embodiments, the distribution and orientation of the TCP coils, the application of the RF power and the phase-shifted modulation are described to provide rotational uniformity to the electric field. The teachings of the various embodiments can be extended to provide radial uniformity for the electric field applied to the plasma in addition to providing the rotational uniformity. To attain radial uniformity, the number, location and orientation of the TCP coils as well as the modulation and phase-shifting applied to the RF power may have to be adjusted to allow transitional rotation of the RF electric field extending outward from the center, for example.

Upon applying the phase-shifted modulation to the RF power, the electric field generated may be measured at different pre-defined probe points to determine the strength of the electric field to ensure uniform application of the RF electric field. The RF electric field may be measured at different times to periodically evaluate the strength of the electric field applied to the plasma. The pre-defined probe points may identify different azimuthal positions within the plasma.

Figure 5:
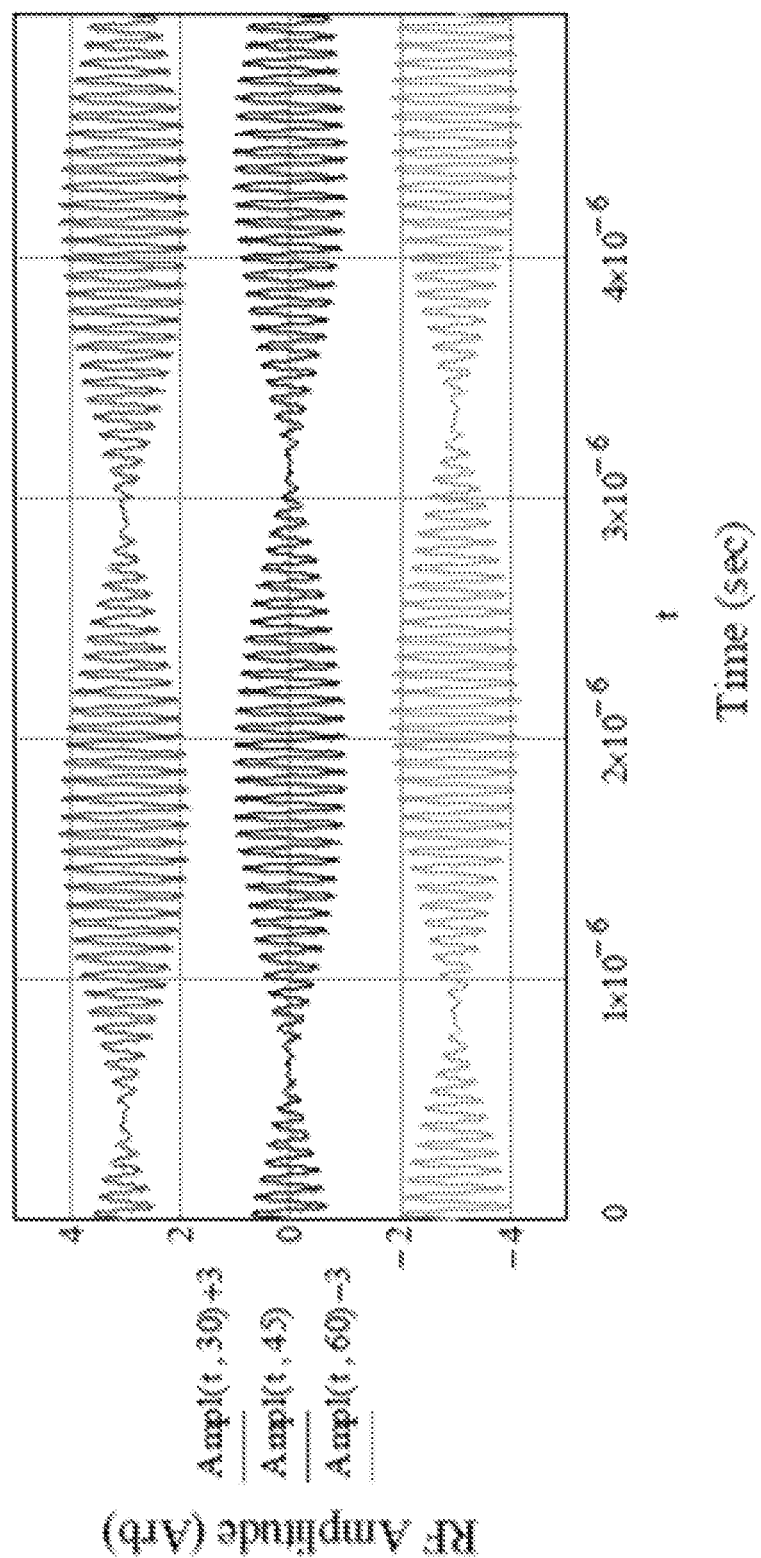
FIG. 5 illustrates the electric field resulting from the modulation applied by a phase-shift modulator, in accordance with one embodiment of the invention.

FIG. 5 is a graphical representation of a electrical field resulting from the modulation of the RF power, in one embodiment. In this embodiment, the RF electric field is calculated for a coil configuration illustrated in FIG. 2A wherein two TCP coils are distributed orthogonal to one another. It should be appreciated that the coil unit of FIG. 2A having multi-loop coil configuration is exemplary and that the embodiment can be extended to include single loop configuration, as well. The two orthogonal electric field components for the TCP coil configuration of FIG. 2A are determined using the following relations:

$$E_1(t, r, \phi) := \frac{0.5}{r \cdot \cos(\phi \cdot \frac{\pi}{180})} \cdot \sin(\omega_1 \cdot t) \cdot \cos(\omega_0 \cdot t)$$

$$E_2(t, r, \phi) := \frac{0.5}{r \cdot \sin(\phi \cdot \frac{\pi}{180})} \cdot \sin(\omega_1 \cdot t) \cdot \sin(\omega_0 \cdot t)$$

Where E1=electric field for coil component 1 (i.e., TCP coil 1 or antenna 1, defined by V/m)

E2=electric field for coil component 2 (i.e., TCP coil 2 or antennat 2, defined by V/m)

t=time (in seconds)

r=radius from center of coil unit (in meters)

$\Phi$=angular position between the TCP coils in the coil unit (measured in radians)

$\omega_0$=RF generator frequency (radians/sec) and $\omega_1$=modulation frequency (radians/sec)

Figure 6A:
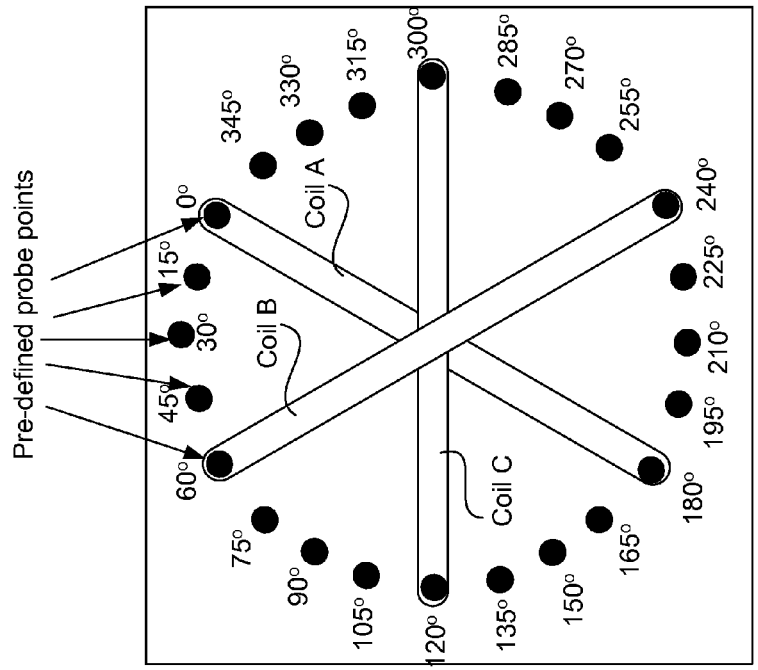
FIGS. 6A and 6B illustrate an exemplary representation of pre-defined probe points used for measuring the rotating electric field, in accordance with one embodiment of the present invention.
Figure 6B:
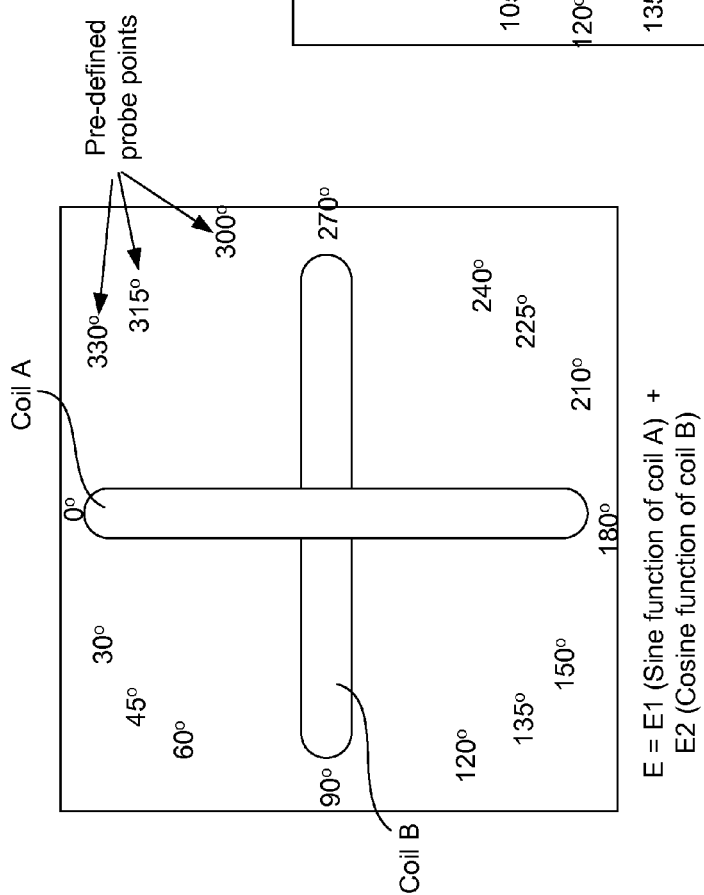

The electric field was measured at three pre-defined points using either a mathematical probe (described by the above equations, for example) or a physical probe (not shown). FIGS. 6A-6B illustrate exemplary pre-defined probe points where the electric field is measured to determine the transitional rotation of the electric field caused by the phase-shifted modulation applied to the RF power. In the embodiment illustrated in FIG. 6A, the exemplary pre-defined probe points used to measure the electric field represented in the graph of FIG. 5 are identified to be at 30°, 45° and 60°, respectively. The RF generator frequency $\omega_0$, as mentioned earlier, is about 13.6 MHz. In the embodiment illustrated in FIG. 6B, the pre-defined probe points may be defined to be closer than the one defined in FIG. 6A. For example, the probe points may be defined at every 15 degree to determine the transitional rotation of the electric field. In the embodiment illustrated in FIG. 6B, three TCP coils are used and as a result, the electric field components (i.e., E1 for coil 1, E2 for coil 2 and E3 for coil 3) may be computed by taking into consideration the three TCP coils.

In the embodiment illustrated in FIG. 5, the modulation frequency applied to the RF generator frequency is about 200 kHz. The amplitudes of the electric field are in arbitrary units and the amplitudes for the three traces provided in the graph are offset for clarity. As mentioned earlier, it is not necessary for the TCP coils (i.e., antennae) in the coil unit to be linear loops. In some embodiments, it may be beneficial for the TCP coils to assume different geometrical shapes in order to improve the electric field uniformity so as to sustain an uniform plasma. Some of the exemplary geometrical shapes that the TCP coils can assume were discussed with reference to FIGS. 2C-2E.

The advantages provided by the various embodiments described herein include making electric field provided to the plasma chamber much more uniform than conventional antennas by distributing a plurality of TCP coils at regular intervals and modulating the frequency of the RF power applied to these TCP coils. Phase shifting the modulation results in rotational and azimuthal uniformity of the RF electric field by making the electric field transition in a rotating pattern, simulating rotation of the physical antenna even while the physical antenna remains stationary. The rotational and/or radial uniformity of the RF electric field can be further enhanced by modifying geometrical shape of the TCP coils in the coil unit, by using multi-loop coils instead of single loop coils, etc.

Traditional way of sustaining RF plasmas used a circular or spiral antenna in proximity to a window of the plasma processing chamber. As a result, the applied RF voltage dropped along the length of the antenna resulting in non-uniform plasma generation. The current embodiments address this non-uniformity by providing TCP coils that are of different geometrical shapes, allowing single or multi-loop coils, allowing modulation of the RF power applied to the TCP coils and phase shifting the applied modulation so as to allow the transition the electric field in a rotating pattern. The resulting electric field applied to the plasma is substantially uniform Improving the geometrical shape and increasing the number of TCP coils further improves the radial, rotational and azimuthal uniformity of the electric field supplied to the plasma.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A plasma processing chamber, comprising:
   a substrate support for receiving and holding a substrate;
   a window in the plasma processing chamber oriented over the substrate support;
   a plurality of transformer coupled plasma (TCP) coils disposed over the window, each one of the plurality of TCP coils is disposed such that an angular difference between any pair of consecutive TCP coils is equal, and connected to power circuitry at one end, an opposite end being electrically grounded,
   wherein the power circuitry includes,
   a1) an RF source to apply RF power to each of the plurality of TCP coils; and
   a2) a phase-shift modulator coupled to an output of the RF source and configured to modulate a frequency of the RF power to produce a phase-shifted frequency for the RF power, wherein the frequency of the RF power is applied to a first one of the plurality of TCP coils and the phase-shifted frequency of the RF power is applied to a second one of the plurality of TCP coils, wherein a difference between the frequency and the phase-shifted frequency is based on an angular difference between the first one and the second one of the plurality of TCP coils that are disposed over the window of the plasma processing chamber.

2. The plasma processing chamber as recited in claim 1, wherein the frequency applied to the first one of the plurality of TCP coils depends on the RF power supplied by the RF source and the difference between the frequency and the phase-shifted frequency depends on a number of the TCP coils within the plurality of TCP coils.

3. The plasma processing chamber as recited in claim 1, wherein when the plurality of TCP coils includes a pair of TCP coils, the TCP coils in the pair are disposed orthogonal to one another and the difference between the frequency and the phase-shifted frequency is equal to the angular difference between the TCP coils in the pair.

4. The plasma processing chamber as recited in claim 1, wherein the power circuitry further includes a match circuit having an RF input and an RF output, the RF input coupled to an output of the phase-shift modulator and the RF output coupled to each one of the plurality of TCP coils.

5. The plasma processing chamber as recited in claim 1, wherein the RF source includes a single RF power generator, the RF power applied to the plurality of TCP coils is split so as to provide same RF power to each one of the plurality of TCP coils at any given time, the phase-shifted frequency of the RF power applied to each of the subsequent ones of the plurality of TCP coils is phase-shifted from the frequency of the RF power applied to the first one of the plurality of TCP coils by the phase-shift modulator, wherein the difference between the frequency and the phase-shifted frequency is based on number of the TCP coils.

6. The plasma processing chamber as recited in claim 1, wherein the RF source includes a plurality of RF power generators, number of RF power generators corresponding to number of TCP coils disposed over the window so as to allow each one of the plurality of TCP coils to be driven by a distinct RF power generator, each one of the plurality of RF power generators is coupled to a corresponding phase-shift modulator, the phase-shifting of the phase-shifted frequency applied by the corresponding phase-shift modulators is coordinated to allow the RF electric field applied to the plurality of TCP coils to transition in a rotating pattern, the difference between the frequency and the phase-shifted frequency depending on number of the TCP coils.

7. The plasma processing chamber as recited in claim 1, further includes a probe to measure RF electric field generated by the RF power at different pre-defined points where the RF electric field is applied.

8. The plasma processing chamber as recited in claim 7, wherein the probe is one of a mathematical probe or a physical probe.

9. The plasma processing chamber as recited in claim 1, wherein the plurality of TCP coils are one of a single loop coil or a multi-loop coil.

10. The plasma processing chamber as recited in claim 1, wherein each TCP coil is made of two sub-coils, the RF power being coupled to each one of the sub-coils at the one end and the opposite end of the two sub-coils being connected to ground.

11. The plasma processing chamber as recited in claim 1, wherein the TCP coils are open-ended triangular shaped coils or closed loop triangular shaped coils or two-dimensional single-loop coils or three-dimensional single-loop coils or two-dimensional multi-loop coils or three-dimensional multi-loop coils or rectangular shaped coils or trapezoidal shaped coils.

12. The plasma processing chamber as recited in claim 1, wherein amount of phase shifting is based on degrees of separation between each consecutive pair of the plurality of TCP coils.

13. The plasma processing chamber as recited in claim 1, wherein the plurality of TCP coils includes two TCP coils, and wherein the RF power applied to the first one and the second one of the plurality of TCP coils generates RF electric field that transitions in a rotating pattern between the first one and the second one of the plurality of TCP coils, based on the difference between the frequency and the phase-shifted frequency applied to the first one and the second one of the plurality of TCP coils.

14. The plasma process chamber of claim 1, wherein application of the frequency of the RF power to the first one of the plurality of TCP coils and the phase-shifted frequency of the RF power to the second one of the plurality of coils is coordinated so as to allow an RF electric field applied to the plurality of TCP coils to transition in a rotating pattern.

* * * * *